United States Patent [19]
Park et al.

[11] Patent Number: 5,776,638
[45] Date of Patent: Jul. 7, 1998

[54] PROJECTION EXPOSURE METHOD AND MASK EMPLOYED THEREIN

[75] Inventors: Young-soh Park; Joo-young Lee, both of Kyungki-do; Young-hun Yu, Seoul, all of Rep. of Korea

[73] Assignee: Samsung Electronics Co., Ltd., Kyungki-Do, Rep. of Korea

[21] Appl. No.: 609,124

[22] Filed: Feb. 29, 1996

[30]     Foreign Application Priority Data

Mar. 13, 1995 [KR]  Rep. of Korea ................ 95-5142

[51] Int. Cl.⁶ .................................................. G03F 9/00
[52] U.S. Cl. ........................................................ 430/5
[58] Field of Search ............................ 430/5, 322, 323, 430/334

[56]       References Cited

U.S. PATENT DOCUMENTS 4,938,841  7/1990  Shahar et al. ...................... 430/313
5,356,738  10/1994  Inoue et al. ........................ 430/5

*Primary Examiner*—S. Rosasco
*Attorney, Agent, or Firm*—Cushman Darby & Cushman IP Group of Pillsbury Madison & Sutro LLP

[57]            ABSTRACT

A method of projection exposure utilizing a mask including a step of exposing an object by utilizing a transparent mask substrate of which the upper surface is slanted at a predetermined angle from a direction perpendicular to the light path and an opaque film pattern is formed at regular intervals on a lower surface of the mask substrate so that the phase difference between adjacent mask patterns occurs due to the slanted mask substrate, thereby reducing the minimum pitch available for pattern formation without a shorter-wavelength light source and without increasing NA by reducing the frequency difference δv to the pitch d of the mask in a given wavelength of a light source and NA.

11 Claims, 2 Drawing Sheets

1

PROJECTION EXPOSURE METHOD AND MASK EMPLOYED THEREIN

BACKGROUND OF THE INVENTION

The present invention relates to a method for projection exposure and a mask employed therein, and more particularly, to a method for projection exposure having improved resolution by the phase difference between adjacent patterns of a mask, and a mask employed therein.

Generally, it is widely noted that various patterns in semiconductor devices are formed by photolithography. According to the photolithography technology of forming patterns, a photoresist film whose solubility varies according to radiation, such as X-rays or ultraviolet light, is formed on a film, e.g., an insulating film or conductive film, where a pattern is to be formed. After a predetermined area of the photoresist film is exposed to light, a photoresist film pattern is formed by removing a portion of the photoresist film having a high solubility with respect to a developing solution. Thus, the exposed portion of the film where the pattern is to be formed is removed by etching so that various patterns such as wiring or electrodes can be formed.

Accordingly, an exposing apparatus plays an important role in the process of forming patterns. There are various types of exposing apparatuses: a contact exposure apparatus, a proximity exposure apparatus, and a projection exposure apparatus. Recently, for projection exposure apparatuses, steppers manufactured by GCA of the US, Nikon and Cannon of Japan are mainly being used due to their higher resolution capabilities in forming patterns.

In the meantime, as higher integration of integrated semiconductor circuits is required, the minimum feature size is becoming minute. Accordingly, a light source for the exposing apparatus employs a shorter wavelength, ranging from an i-line wavelength of 0.365 μm to a deep UV wavelength of 0.248 μm. For instance, the minimum feature size required for 256 Mega DRAMs is about 0.25 μm, which is nearly the same level of an exposure wavelength of a stepper apparatus using a KrF excimer laser as the light source. In this case, a photoresist pattern on a wafer is severely deformed due to the diffraction and interference of incident light caused by the mask and, and particularly, the deformation in fine patterns of the same size of the wavelength of the exposing light source is very severe.

To solve the above problem, a phase shift method for improving resolution by using a mask pattern has been proposed. The phase shift method is for exposing the pattern by using the mask (hereinafter, called a "phase shift mask") including a phase shifter. The phase shift mask increases resolution or depth of focus by using interference or partial interference of light to expose a pattern of a desired size.

That is, when light passes a mask substrate or a shifter film, the wavelength of the light reduces to a value of a divided wavelength by the refractive index in a vacuum. Hence, light path difference occurs to light that are in the same phase according to whether the shift exists or not. Here, when the light path difference is θ, θ=2π(n−1)/λ (n: refractive index of the shifter, t: thickness of the shifter, and λ: wavelength in use). When θ is π, the light having passed the shifter bears the reverse phase. Thus, since the light passing through a light transmitting portion and a shifter are out of phase by half a cycle, respectively, light strength becomes zero in the boundary area of the pattern leading to an increase in contrast by disposing the shifter at the edge of the mask pattern.

FIGS. 1A through 1C are views for explaining the minimum pitch which is available for pattern formation when conventional transmission masks and phase shift masks are used. To be more precise, FIG. 1A is a view illustrating the distribution of amplitude and spatial frequency when the conventional transmission mask is used, and FIGS. 1B and 1C are views illustrating the distribution of amplitude and spatial frequency when a conventional Levenson-type phase shift mask and a Gray tone phase shift mask are used, respectively.

In general, the minimum pitch for pattern formation in a line-space type pattern is given as follows.

$$\text{Pitch} > 1/v_c, \quad v_c = NA/\lambda \tag{1}$$

Here, NA signifies the numerical aperture (NA) of a lens; λ signifies the wavelength of a light source; and $v_c$ signifies the critical frequency. Equation (1) relates to the usual transmission mask shown in FIG. 1A. For a phase shift mask, the difference δv of the spatial frequency between the zero-order light and the first-order light decreases by setting the phase difference between the adjacent patterns 180° so that the pitch available for pattern formation can be reduced. This is because amplitude cycle d' of the phase shift mask equals "2d," contrary to "d" of the usual transmission mask, when light is projected using a mask of pitch "d" as shown in FIGS. 1A and 1B. Namely, since the frequency difference δv between the zero-order light and the first-order light in the spatial frequency is given as 1/d', d' of the transmission mask becomes d and that of the phase shift mask becomes 2d. As a result, the minimum pitch of the phase shift mask which can be implemented within the range of $-v_c \sim v_c$ may be reduced by ½, compared to the transmission mask.

Further, as shown in FIG. 1C, a phase difference of 90° between the adjacent patterns makes the amplitude cycle d' "4d" and greatly decreases the δv down to ¼, compared to the transmission mask. As a result, the minimum pitch available for implementing the pattern also becomes ¼ of the transmission mask However, the manufacturing of the gray-tone type phase shift mask is extremely difficult and sophisticated so that minute adjustment thereof proves impossible and the mask cannot be actually placed in use.

SUMMARY OF THE INVENTION

To solve the above problems, it is an object of the present invention to provide a method for projection exposure utilizing a mask having improved resolution by the phase difference between adjacent mask patterns.

It is another object of the present invention to provide a mask having improved resolution which is employed in the above projection exposure method.

Accordingly, to achieve the first object, there is provided a method of projection exposure utilizing a mask comprising the step of exposing an object by utilizing a transparent mask substrate of which the upper surface is slanted at a predetermined angle from a direction perpendicular to a light path and an opaque film pattern is formed at regular intervals on a lower surface of the mask substrate, so that a phase difference between adjacent mask patterns occurs due to the slanted mask substrate.

It is preferred in the present invention that the phase difference is ndtanθ, where, "n" signifies the refractive index of the mask substrate, "d" signifies the pitch of the mask, and θ signifies the angle of the slanted mask substrate.

To achieve the second object, there is provided a mask comprising: a transparent mask substrate of which the upper surface is slanted at a predetermined angle from a direction perpendicular to a light path and an opaque film pattern formed at regular intervals on a lower surface of the mask substrate, whereby the phase difference between adjacent mask patterns occurs due to the slanted mask substrate.

It is preferred in the present invention that the phase difference is ndtanθ, where, "n" signifies the refractive index of the mask substrate, "d" signifies the pitch of the mask, and θ signifies the angle of the slanted mask substrate.

According to another mask of the present invention, the present invention provides a mask comprising: a transparent mask substrate of which a first surface is slanted at a predetermined angle from a direction perpendicular to a light path and an opaque film pattern regularly formed on a second surface of the mask substrate.

In a resolution-improving mask of the present invention, the minimum pitch available for pattern formation can be reduced without a shorter-wavelength light source and without increasing NA, by reducing the wavelength difference δv to the pitch d of the mask in a given wavelength of a light source and NA.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1A:
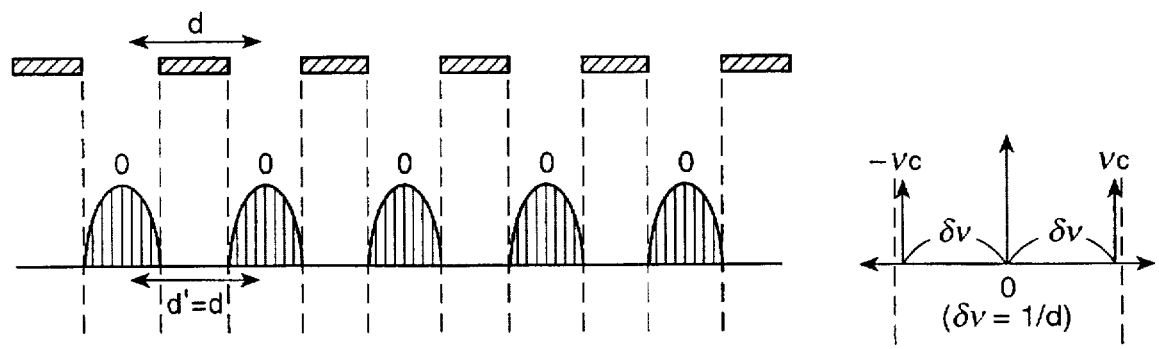
FIGS. 1A through 1C are views for explaining the minimum pitch which is available for pattern formation when a conventional transmission mask and phase shift mask are used.
Figure 1B:
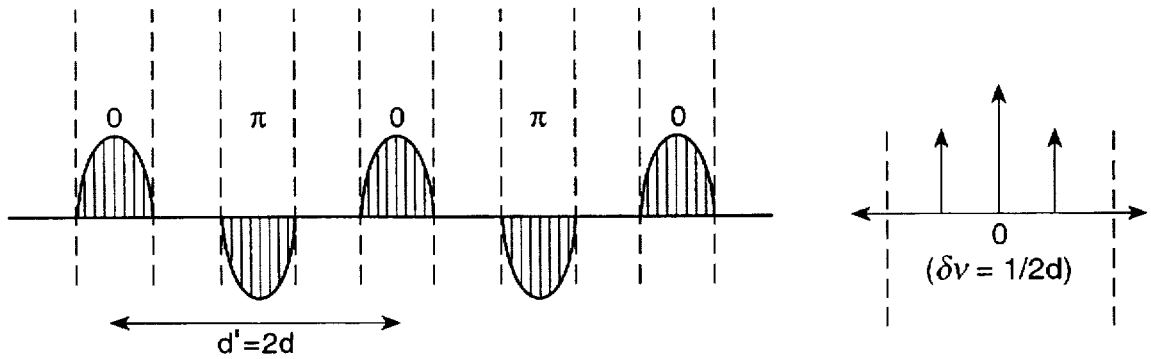
Figure 1C:
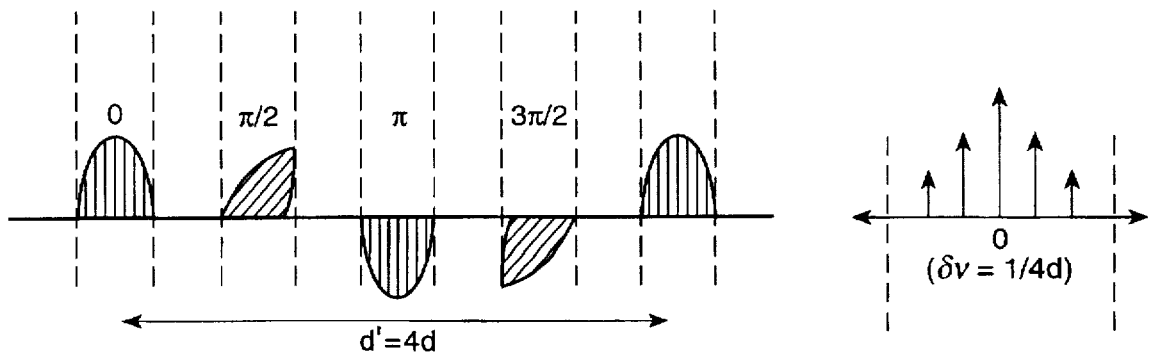
Figure 2A:
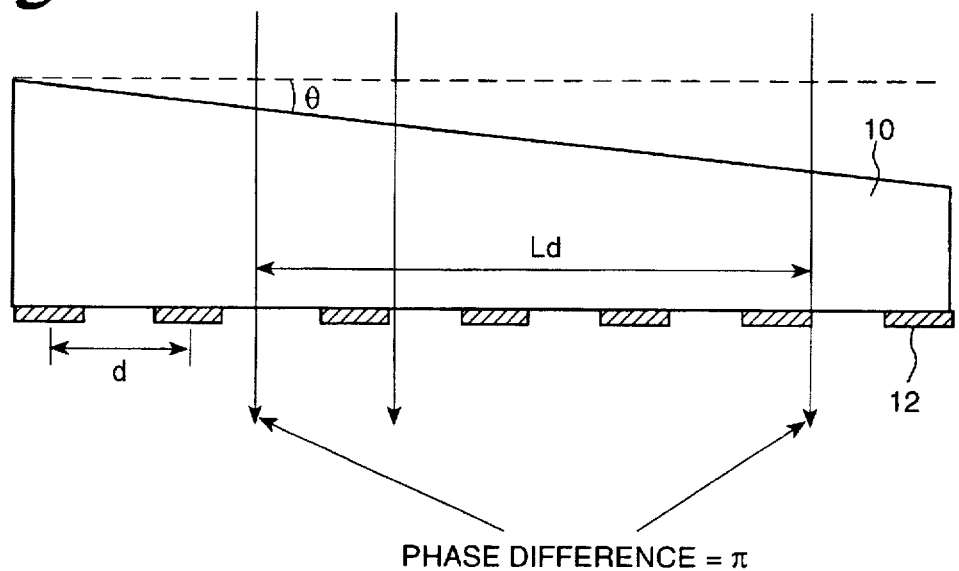
FIGS. 2A through 2C are views for explaining a projection exposure method utilizing a resolution-improving mask with a slanted mask substrate according to the present invention.
Figure 2B:
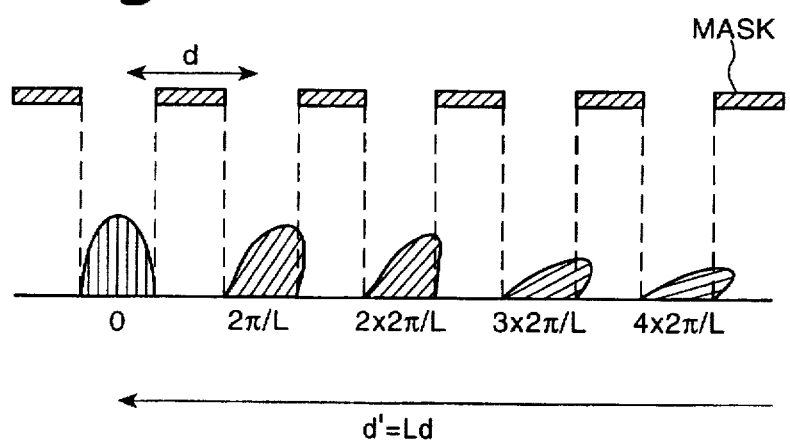
Figure 2C:
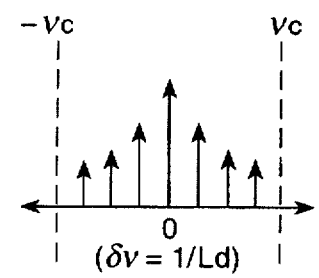

FIGS. 2A through 2C are views for explaining a projection exposure method utilizing a resolution-improving mask with a slanted mask substrate according to the present invention. To be more precise, FIG. 2A is a view showing a resolution-improving mask of the present invention, and FIGS. 2B and 2C are views showing amplitude and spatial frequency distribution when the pattern is formed by utilizing the resolution-improving mask of the present invention.

As shown in FIGS. 2A–2C, the upper surface of mask substrate 10 is slanted at a predetermined angle and opaque mask pattern 12 is formed on the lower surface of mask substrate 10. In the mask of the present invention, the upper surface of mask substrate 10 is being slanted at an angle θ so that the phase difference between two adjacent patterns becomes ndtanθ. Here, "n" signifies the refractive index of glass, and "d" signifies the pitch. When a phase difference between two patterns occurs, cycle d' of amplitude becomes d'=Ld, L=λ/ndtanθ, as shown in FIG. 2B. Accordingly, the wavelength difference δv between the zero-order light and the first-order light in the spatial frequency may be given by 1/Ld.

Consequently, "L" can be controlled by adjusting "θ." Since δv to pitch "d" decreases according to wavelength and NA of a given light source, the minimum pitch available for pattern formation becomes 1/L so that a minute pattern can be obtained without a shorter-wavelength light source and without increasing NA.

It is noted that the present invention is not limited to the preferred embodiment described above, and it is apparent that variations and modifications by those skilled in the art can be effected within the spirit and scope of the present invention as defined in the appended claims.

What is claimed is:

1. A method of projection exposure utilizing a mask comprising:

exposing an object by utilizing a transparent mask substrate having an upper surface slanted at a predetermined angle from a direction perpendicular to the light path; and an opaque film pattern formed at regular intervals on a lower surface of said mask substrate; and wherein the phase difference between adjacent mask patterns occurs due to said slanted mask substrate.

2. A method of projection exposure according to claim 1, wherein said phase difference is ndtanθ, where, "n" signifies the refractive index of the mask substrate, "d" signifies the pitch of said mask, and θ signifies the angle of said slanted mask substrate.

3. A method of projection exposure according to claim 1, wherein the entire surface of said upper surface is slanted at said predetermined angle.

4. A mask comprising:

a transparent mask substrate having an upper surface slanted at a predetermined angle from a direction perpendicular to a light path; and an opaque film pattern formed at regular intervals on a lower surface of said mask substrate; and wherein the phase difference between adjacent mask patterns occurs due to said slanted mask substrate.

5. A mask according to claim 4, wherein said phase difference is ndtanθ, where, "n" signifies the refractive index of the mask substrate, "d" signifies the pitch of said mask, and θ signifies the angle of said slanted mask substrate.

6. A mask according to claim 4, wherein the entire surface of said upper surface is slanted at said predetermined angle.

7. A mask comprising:

a transparent mask substrate having a first surface slanted at a predetermined angle from a direction perpendicular to a light path; and an opaque film pattern formed at regular intervals on a second surface of said mask substrate, said first and second surfaces being on opposite sides of said mask substrate.

8. A mask according to claim 7, wherein the entire surface of said first surface is slanted at said predetermined angle.

9. A mask comprising:

a transparent mask substrate having a first surface slanted a predetermined angle from a direction perpendicular to a light path; and an opaque film pattern on a second surface of said mask substrate, said first and second surfaces being on opposite sides of said mask substrate.

10. A mask according to claim 9, wherein the first surface is the upper surface of the substrate.

11. A mask according to claim 9, wherein the entire surface of said first surface is slanted at said predetermined angle.

\* \* \* \* \*